(12) United States Patent
Najafi et al.

(10) Patent No.: US 12,045,166 B2
(45) Date of Patent: Jul. 23, 2024

(54) ARCHITECTURE AND METHOD FOR BINARY AND UNARY IN-MEMORY SORTING

(71) Applicant: UNIVERSITY OF LOUISIANA LAFAYETTE, Lafayette, LA (US)

(72) Inventors: Mohammadhassan Najafi, Lafayette, LA (US); Mohsen Riahi Alam, Lafayette, LA (US); Nima Taherinejad, Lafayette, LA (US)

(73) Assignee: University of Louisiana at Lafayette, Lafayette, LA (US)

( * ) Notice: Subject to any disclaimer, the term of this patent is extended or adjusted under 35 U.S.C. 154(b) by 30 days.

(21) Appl. No.: 18/080,666

(22) Filed: Dec. 13, 2022

(65) Prior Publication Data

US 2023/0195621 A1   Jun. 22, 2023

Related U.S. Application Data

(60) Provisional application No. 63/290,502, filed on Dec. 16, 2021.

(51) Int. Cl.
  *G06F 12/06* (2006.01)
  *G06F 12/02* (2006.01)
(52) U.S. Cl.
  CPC ...... *G06F 12/0646* (2013.01); *G06F 12/0238* (2013.01); *G06F 2212/1016* (2013.01)
(58) Field of Classification Search
  CPC ......... G06F 12/0646; G06F 2212/1016; G06F 12/0238; G06F 12/0284; G06F 15/7821; G11C 2013/0073; G11C 13/0007; G11C 13/0069; H03K 19/185
  USPC .................................................. 711/170, 100
  See application file for complete search history.

(56) References Cited

PUBLICATIONS

NPL Pyne, "Instruction Controlled In-memory Sorting on Memristor Crossbars", 2021 34th International Conference on VLSI Design and 2021 20th International Conference on Embedded Systems (VLSID), Feb. 2021 (Year: 2021).*
NPL Thangkhiew et al., "An efficient memristor crossbar architecture for mapping Boolean functions using Binary Decision Diagram (BDD)", The VLSI Journal 71, 2020 (Year: 2020).*
NPL Hamdioui et al., "Memristor Based Computation-in-Memory Architecture for Data-Intensive Applications", 2015 Design, Automation & Test in Europe Conference & Exhibition (Date), 2015 (Year: 2015).*
Memristor Crossbar array (Year: 2021).*
Memristor Crossbar Array (Year: 2020).*

* cited by examiner

*Primary Examiner* — David Yi
*Assistant Examiner* — Zubair Ahmed
(74) *Attorney, Agent, or Firm* — Kean Miller LLP; Jessica C. Engler; Russel O. Primeaux

(57) ABSTRACT

Disclosed herein is an architecture for in-memory sorting of data and methods by utilizing memristors crossbar arrays to perform in-memory sorting for both unary bit-stream and binary format data sets and method for utilizing same. Evaluations of the disclosed architecture and method reflect a significant reduction in energy costs and processing time as compared to currently available solutions.

13 Claims, 10 Drawing Sheets

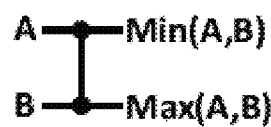
FIGURE 1A
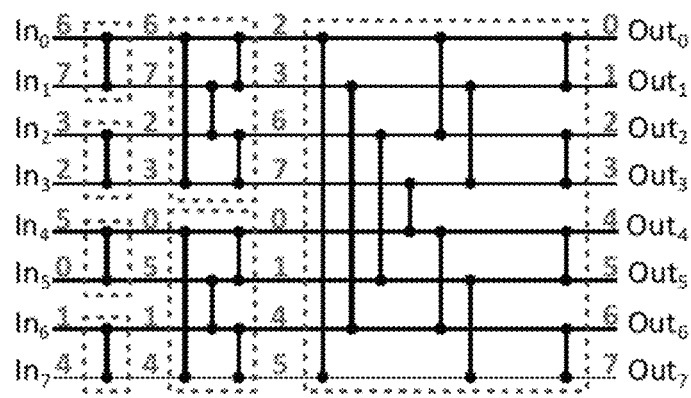
FIGURE 1B
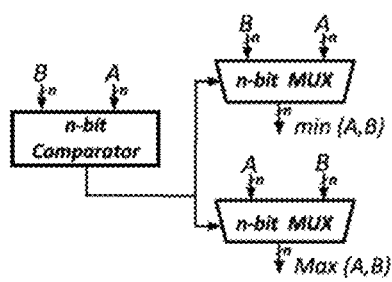 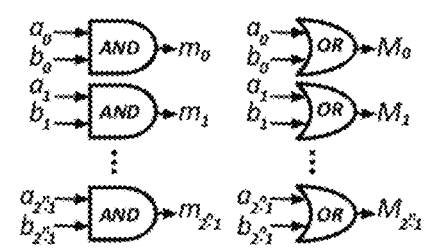
FIGURE 2A          FIGURE 2B

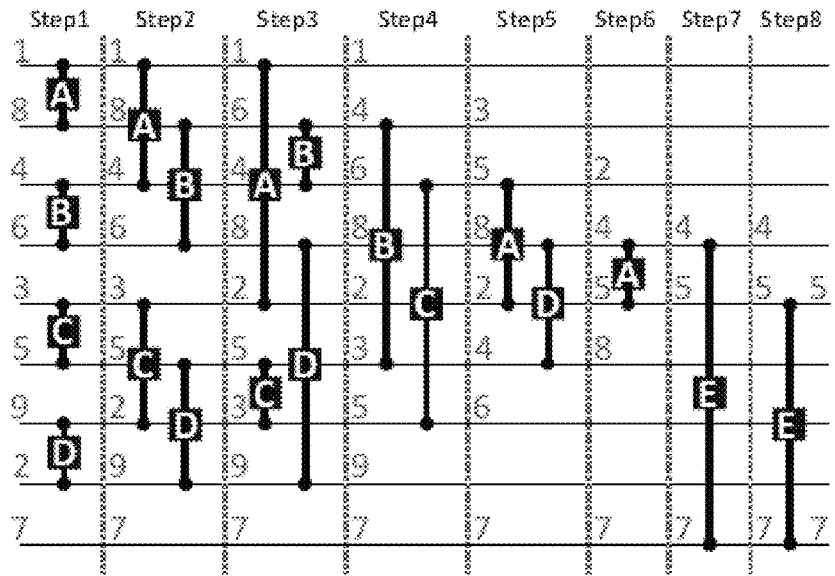

FIGURE 10

| Data-Width | Required Dimension | # of Initialized Memristors | # of Reused Memristors | # of Logical Operation Cycles | # of Copies [Copy Cycles] | Reused init Cycles | Total # of Cycles | Energy ($pJ$) |
|---|---|---|---|---|---|---|---|---|
| 4 | 4×14 | 40 | 44 | 21 | 6 (12) | 6 | 39 | 199.4 |
| 8 | 8×22 | 88 | 88 | 25 | 14 (28) | 10 | 63 | 417 |
| 16 | 16×38 | 184 | 176 | 33 | 30 (60) | 18 | 111 | 845 |
| 32 | 32×70 | 376 | 352 | 49 | 62 (124) | 34 | 207 | 1728 |
| $n$ | $n \times (8+2n-2)$ | $12n-8$ | $11n$ | $18+(n-1)$ | $2n-2$ [$2(2n-2)$] | $n+2$ | $6n+15$ | - |

FIGURE 11

| Network Size | Binary Sorting DW = 4 | | | DW = 8 | | | DW = 16 | | | DW = 32 | | |
|---|---|---|---|---|---|---|---|---|---|---|---|---|
| | Cycles | Size | Energy | Cycles | Size | Energy | Cycles | Size | Energy | Cycles | Size | Energy |
| 4 | 128 | 4×28 | 1.2 | 200 | 8×44 | 2.5 | 344 | 16×76 | 5.1 | 632 | 32×140 | 10 |
| 8 | 280 | 4×56 | 4.7 | 424 | 8×88 | 10 | 712 | 16×152 | 20 | 1288 | 32×280 | 41 |
| 16 | 544 | 4×112 | 15 | 784 | 8×176 | 33 | 1264 | 16×304 | 68 | 2224 | 32×560 | 138 |
| 32 | 1048 | 4×224 | 47 | 1408 | 8×352 | 100 | 2128 | 16×608 | 205 | 3568 | 32×1120 | 415 |
| Network Size | Unary Sorting BL = 16 | | | BL = 64 (DW = 6) | | | BL = 256 (DW = 8) | | | BL = 1024 (DW = 10) | | |
| | Cycles | Size | Energy | Cycles | Size | Energy | Cycles | Size | Energy | Cycles | Size | Energy |
| 4 | 26 | 16×10 | 1.37 | 26 | 64×10 | 5.4 | 26 | 256×10 | 21.88 | 26 | 1024×10 | 87 |
| 8 | 76 | 16×20 | 5.4 | 76 | 64×20 | 21 | 76 | 256×20 | 87 | 76 | 1024×20 | 350 |
| 16 | 194 | 16×40 | 18 | 194 | 64×40 | 72 | 194 | 256×40 | 291 | 194 | 1024×40 | 1168 |
| 32 | 538 | 16×80 | 54 | 538 | 64×80 | 218 | 538 | 256×80 | 875 | 538 | 1024×80 | 3503 |
| 64 | 1406 | 16×160 | 153 | 1406 | 64×160 | 613 | 1406 | 256×160 | 2452 | 1406 | 1024×160 | 9809 |
| 128 | 3624 | 16×320 | 408 | 3624 | 64×320 | 1635 | 3624 | 256×320 | 6540 | 3624 | 1024×320 | 26159 |
| 256 | 9176 | 16×640 | 1051 | 9176 | 64×640 | 4204 | 9176 | 256×640 | 16817 | 9176 | 1024×640 | 67268 |

FIGURE 12

| BitStream Length | Required Dim. | # of Initialized Memristors | # of Reused Memristors | # of NOR Operations | # of NOT Operations | Initial Cycles | Operation Cycles | Energy ($pJ$) |
|---|---|---|---|---|---|---|---|---|
| $2^3$ | 16 × 5 | 64 | 32 | 32 | 48 | 1 | 5 | 227 |
| $2^6$ | 64 × 5 | 256 | 128 | 128 | 192 | 1 | 5 | 910 |
| $2^8$ | 256 × 5 | 1024 | 512 | 512 | 768 | 1 | 5 | 3640 |
| $2^{10}$ | 1024 × 5 | 4096 | 2048 | 2048 | 3072 | 1 | 5 | 14358 |

FIGURE 13

| Parameter | Value | Parameter | Value |
|---|---|---|---|
| $R_{on}$ | 1 kΩ | $x_{off}$ | 3 $nm$ |
| $R_{off}$ | 300 kΩ | $k_{on}$ | -216.2 m/sec |
| $VT_{on}$ | -1.5 V | $k_{off}$ | 0.091 m/sec |
| $VT_{off}$ | 300 mV | $a_{on}$ | 4 |
| $x_{on}$ | 0 nm | $a_{off}$ | 4 |

FIGURE 14

| Operation | Average Energy |
|---|---|
| memristor initialization | 2350 $fJ$ |
| memristor copy | 40.08 $fJ$ |
| NOT | 20.04 $fJ$ |
| 2-input NOR | 9.01 $fJ$ |
| 3-input NOR | 37.24 $fJ$ |
| 4-input NOR | 54.51 $fJ$ |

FIGURE 15

| Network Size | 8 | | 16 | | 32 | | 64 | | 128 | | 256 | |
|---|---|---|---|---|---|---|---|---|---|---|---|---|
| Design Method | E | L | E | L | E | L | E | L | E | L | E | L |
| Off-Memory Binary Sorting (+ Binary R/W) | 850 | 6.5 | 1,701 | 13 | 3,403 | 26 | 6,806 | 52 | 13,613 | 104 | 27,227 | 209 |
| Proposed In-Memory Binary Sorting | 10 | 0.55 | 33 | 1.02 | 100 | 1.8 | 281 | 3.4 | 794 | 6.8 | 1,927 | 14 |
| Off-Memory Unary Sorting (+ Binary R/W) | 851 | 6.5 | 1,703 | 13 | 3,406 | 26 | 6,811 | 52 | 13,622 | 104 | 27,244 | 209 |
| Off-Memory Unary Sorting (+ Unary R/W) | 27,226 | 210 | 54,452 | 419 | 108,904 | 839 | 217,809 | 1,679 | 435,618 | 3358 | 871,236 | 6,717 |
| Proposed In-Memory Unary Sorting | 87 | 0.10 | 291 | 0.25 | 875 | 0.7 | 2,452 | 1.8 | 6,540 | 4.7 | 16,817 | 12 |

FIGURE 16

| | Median Filter 3 x 3 | | | | | | |
|---|---|---|---|---|---|---|---|
| Design | $PC_t$ | $M_t$ | $E\,(\mu J)$ | $L\,(\mu s)$ | Design | $E\,(\mu J)$ | $L\,(\mu s)$ |
| Proposed Binary | 544 | 8 x 110 | 0.0085 | 0.68 | Off-Memory Binary | 0.121 | 0.94 |
| Proposed Unary | 72 | 256 x 25 | 0.069 | 0.09 | Off-Memory Unary | 3.882 | 30 |
| | 64 x 64 Image Processor | | | | | | |
| Proposed Binary | 4896 | 208 x 1980 | 35 | 6.1 | Off-Memory Binary | 490 | 3,200 |
| Proposed Unary | 684 | 2048 x 1425 | 283 | 0.81 | Off-Memory Unary | 1,590 | 104,000 |

FIGURE 17

ARCHITECTURE AND METHOD FOR BINARY AND UNARY IN-MEMORY SORTING

CROSS REFERENCE TO RELATED APPLICATIONS

This application claims priority to U.S. Provisional Application No. 63/290,502 titled "Architecture and Method for In-Memory Sorting" filed on Dec. 16, 2021.

STATEMENT REGARDING FEDERALLY SPONSORED RESEARCH OR DEVELOPMENT

Not applicable.

FIELD OF THE INVENTION

The field of this invention relates to sorting of data by computing systems; specifically, the sorting of data in computing systems through the use of memristors and memristor crossbar arrays.

BACKGROUND OF THE INVENTION

Sorting is a fundamental operation in computer science, used in databases, scientific computing, scheduling, artificial intelligence and robotics, image, video, and signal processing. A sizeable body of research has focused on harnessing the computational power of many core Central Processing Unit (CPU)- and Graphics Processing Unit (GPU)-based systems for efficient sorting. For high-performance applications, sorting is implemented in hardware using either Application Specific Integrated Circuits (ASICs) or Field Programmable Gate Arrays (FPGAs). The parallel nature of hardware-based solutions allows them to outperform software-based solutions executed on CPUs/GPUs.

The usual approach for hardware-based sorting is to wire up a network of Compare-and-Swap (CAS) units in a configuration called a Batcher (or bitonic) network. Batcher networks provide low-latency solutions for hardware-based sorting. Each CAS block compares two input values and, if required, swaps the values at the output. FIG. 1A shows the schematic symbol of a CAS block currently known in the art. FIG. 1B shows the CAS network for an 8-input bitonic sorting network, made up of 24 CAS blocks. Batcher sorting networks are fundamentally different from software algorithms for sorting (such as the quicksort, merge sort, and the bubble sort), where the order of comparisons is fixed in advance. That is, in contrast to software algorithms, that the order is data dependent. The implementation cost of a batcher networks is a direct function of the number of CAS blocks and the cost of each block. A CAS block is conventionally designed based on the weighted binary radix representation of data. The CAS design consists of an n-bit comparator and two n-bit multiplexers, where n is the data-width of the input data. FIG. 2A shows the conventional design of a CAS unit in the art. In the conventional binary design, increasing the data-width increases the complexity of the design.

All these prior sorting designs were developed based on the Von-Neumann architecture, separating the memory unit and the processing unit. A significant portion of the total processing time and the total energy consumption is wasted on (1) reading the data from memory, (2) transferring the data between memory and processing unit, and (3) writing the result back into the memory. In-Memory Computation (IMC) or Processing in Memory (PIM) is an emerging computational approach that offers the ability to both store and process data within memory cells. This technique eliminates the high overhead of transferring data between memory and processing unit, improving performance, and reducing energy consumption by processing data in memory. For data intensive applications, developing efficient IMC methods is an active area of research.

One of the promising technologies for IMC is memristive technology, which incorporates memristors into the designs. Memristors are electrical components that whose electrical resistance changes as a result of the electrical current flowing through the component. The memristor regulates the flow of electrical current through it and stores the amount of charge previously flowed through it, making it suitable for memory-based applications like IMC. Among various memristive-based IMC methods, stateful logics such as Material Implication (IMPLY), Memristor-Aided Logic (MAGIC), FELIX, and Single-cycle In-Memristor XOR (SIXOR) are of the most efficient solutions. In stateful logics, the input and output are both presented as the state of input and output memristors. Hence, no access to the world outside the array (e.g., read or write) is necessary for stateful logic operations. MAGIC considers two states of memristors: LRS as logical '1' and HRS as logical '0'. FIG. 3A shows how NOR and NOT logical operations can be implemented in MAGIC, where the memristors connected to the ground are output memristors. Before starting the execution of an operation, the output memristors are first initialized to LRS. By applying a specific voltage (0) to the negative terminal of the input memristors, the output memristors may experience a state change from LRS to HRS, depending on the states of the inputs. The truth tables embedded in FIG. 3A show all possible cases of the input memristors' states and switching of the output memristors. FIG. 3B shows how MAGIC NOT and NOR can be realized in a crossbar memory. These operations can be natively executed within memory with a high degree of parallelism. Thus, parallel architectures such as sorting networks can benefit greatly from such IMC logics.

A CAS block in conventional binary radix requires one n-bit comparator and two n-bit multiplexers. Only one prior near/in-memory magnitude comparator currently exists in the art, wherein in-memory XOR operations perform a bit-wise comparison between corresponding bits of two data beginning from the most significant bit towards the least significant bit. However, the comparison process involves reading the output of the XOR operations and the data from memory by the control unit (a near-memory operation). Therefore, its latency (i.e., number of processing cycles) is non-deterministic and depends on the data being compared.

Unary (or burst) processing is an alternative computing paradigm to conventional binary offering simple and noise-tolerant solutions for complex arithmetic functions. The paradigm borrows the concept of averaging from stochastic computing (SC), but is deterministic and accurate. In unary processing, unlike weighted binary radix, all digits are weighted equally. Numbers are encoded uniformly by a sequence of one value (e.g., 1) followed by a sequence of the other value (e.g., 0) in a stream of 1's and 0's—called a unary bit-stream. The value of a unary bit-stream is determined by the frequency of the appearance of 1's in the bit-stream. For example, 11000000 is a unary bit-stream representing 2/8 or 1/4.

Unary computing has been recently exploited for the simple and low-cost implementation of sorting network circuits. With unary bit-streams and also when using correlated stochastic bit-streams, minimum and maximum functions (the main operations in a CAS block) can be implemented using simple standard AND and OR gates. In a serial manner, one AND and one OR gate implements a CAS block by processing one bit of the two bit-streams at each cycle. Hence, a total of $2^n$ processing cycles is needed to process two $2^n$-bit bit-streams (equivalent to two n-bit binary data since the selected precision of binary to unary conversion is equal to the data-width, that is, equal to n). More than 90% saving in the hardware cost is reported for a 256-input serial unary sorting circuit at the cost of processing time. Alternatively, the bit-streams can be processed in one cycle by replicating the logic gates and performing the logical operations in parallel. FIG. 2B shows the parallel unary design of a CAS block. $2^n$ pairs of AND and OR gates sort two $2^n$-bit bit-streams.

SUMMARY OF THE INVENTION

Herein disclosed is an architecture for sorting data completely in memory. Two architecture embodiments are proposed. The first embodiment, "Binary Sorting", is based on the conventional weighted binary representation and is applicable to conventional systems that store the data in memory in the binary format. The second embodiment, "Unary Sorting", is based on the non-weighted unary representation. The two embodiments have different advantages and disadvantages, making one or the other more suitable for a specific application. However, the common property of both is a significant reduction in the processing time compared to prior sorting designs. Testing shows on average 37× and 138× energy reduction for binary and unary designs, respectively, as compared to conventional CMOS-based off-memory sorting systems. The embodiments further employ two in-memory binary and unary designs for an important application of sorting, median filtering. Synthesis results show an improvement of at least three orders of magnitude for this end-application. The improvement is expected to scale up for larger or more complex applications.

The architecture utilizes IMC to implement sorting units on memristive memory arrays, demonstrating the benefits of Unary Computing to improve the sorting hardware further for particular applications. For each embodiment, the operation of sorting two n-bit data (i.e., a CAS block) is demonstrated. A further embodiment of complete sorting networks, made up of the proposed in-memory CAS units, is also detailed. Showcased are the role and importance of the achieved gains in the context of a median filter used in image processing applications.

BRIEF DESCRIPTION OF THE DRAWINGS

The drawings constitute a part of this specification and include exemplary embodiments of the ARCHITECTURE FOR IN-MEMORY SORTING AND METHOD FOR PRACTICING SAME, which may be embodied in various forms. It is to be understood that in some instances, various aspects of the invention may be shown exaggerated or enlarged to facilitate an understanding of the invention. Therefore, the drawings may not be to scale.

FIG. 1A provides a schematic of a CAS block known in the art.

FIG. 1B provides a schematic of a CAS network for an 8-input bitonic sorting.

FIG. 2A provides the logic design of a CAS block for conventional binary design processing data.

FIG. 2B provides the logic design of a CAS block for parallel unary design processing unary bit-streams.

FIG. 10 provides a high-level flow of the 3×3 Median filtering design.

FIG. 11 provides a chart of the required resources and number of processing cycles for the proposed basic binary sorting unit.

FIG. 12 provides a chart of the number of processing cycles, size of crossbar memory, and energy consumption (nJ) to implement different bitonic sorting networks (where DW=Data-Width, BL=Bit-Stream Length).

FIG. 13 provides a table of the Required Resources, Number of Processing Cycles, and Energy Consumption of the Basic Unary Sorting Architecture.

FIG. 14 provides a table of parameter values used in the VTEAM Model.

FIG. 15 provides a table of the average measured energy consumption of each operation based on VTEAM Model.

FIG. 16 provides a table of the energy consumption (nJ) and latency (µs) of the implemented in-memory and off-memory bitonic sorting designs with data-width=8 (wherein E: Energy, L: Latency).

FIG. 17 provides a table of the Required Resources ($M_r$), Latency (L), and Energy Consumption (E) of the Implemented Median Filter Designs.

DETAILED DESCRIPTION OF THE INVENTION

The subject matter of the present invention is described with specificity herein to meet statutory requirements. However, the description itself is not intended to necessarily limit the scope of claims. Rather, the claimed subject matter might be embodied in other ways to include different steps or combinations of steps similar to the ones described in this document, in conjunction with other present or future technologies.

Presented herein is an architecture and method for in-memory sorting of binary radix data. First discussed is the implementation of a sorting unit and then the embodiments of the related architecture to complete sort systems.

Figure 3A:
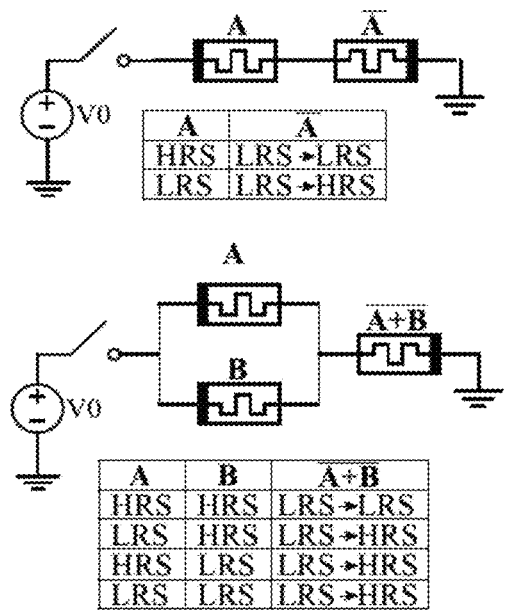
FIG. 3A provides the NOT and NOR logical operations in MAGIC and their truth tables, wherein Low Resistance State (LRS) and High Resistance State (HRS) represent logical '1' and logical '0', respectively.
Figure 3B:
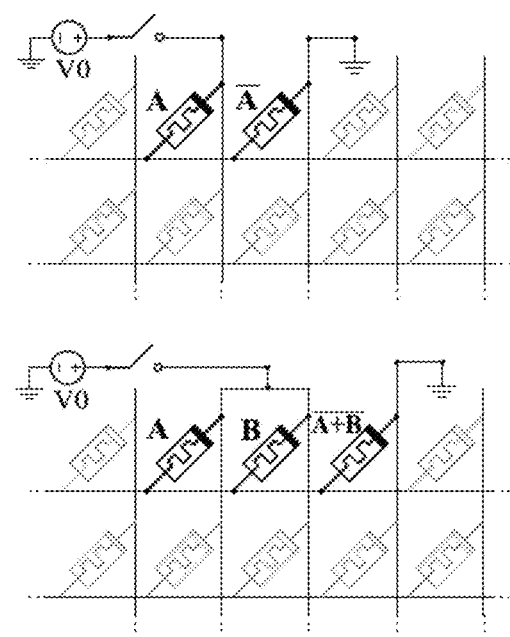
FIG. 3B provides the Crossbar implementation of NOT and NOR logical operation, wherein Low Resistance State (LRS) and High Resistance State (HRS) represent logical '1' and logical '0', respectively.
Figure 4A:
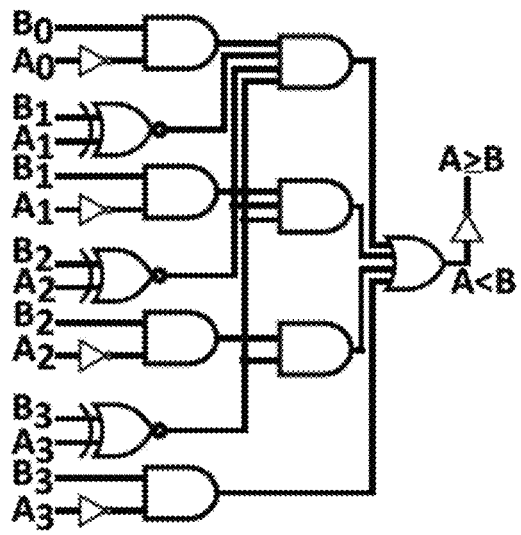
FIG. 4A provides the logic design of a 4-bit binary magnitude comparator.
Figure 5A:
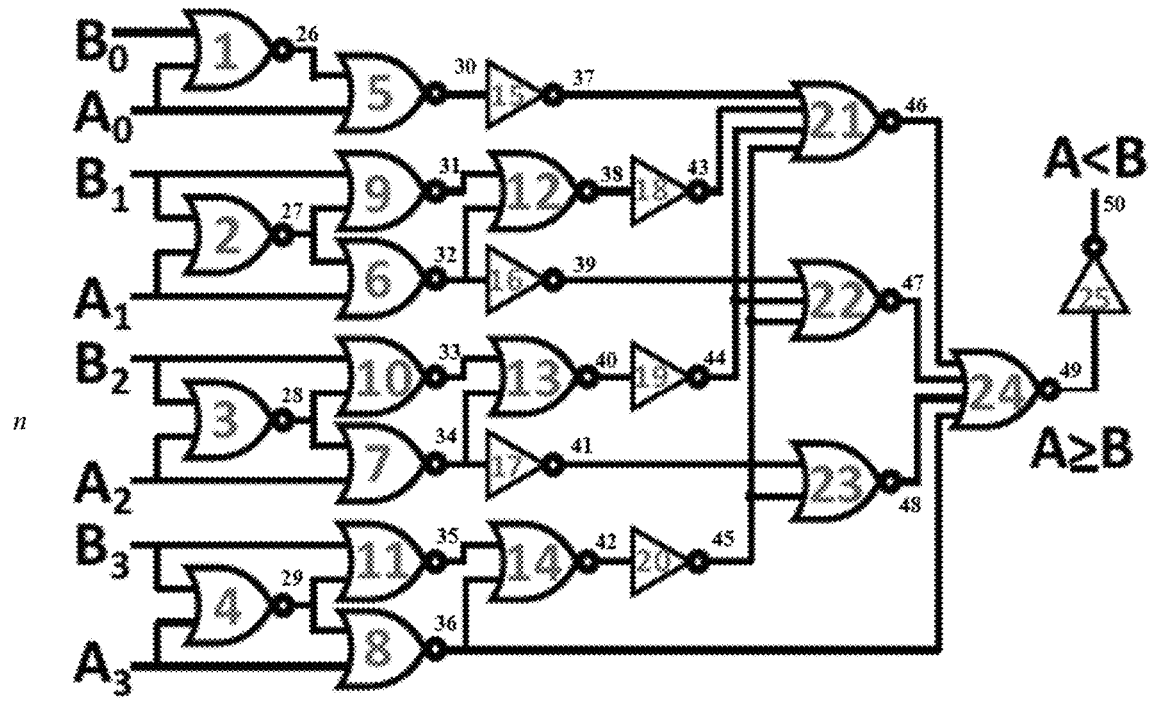
FIG. 5A provides a rendering of a NOR-based logic design of a 4-bit binary comparator.
Figure 5B:
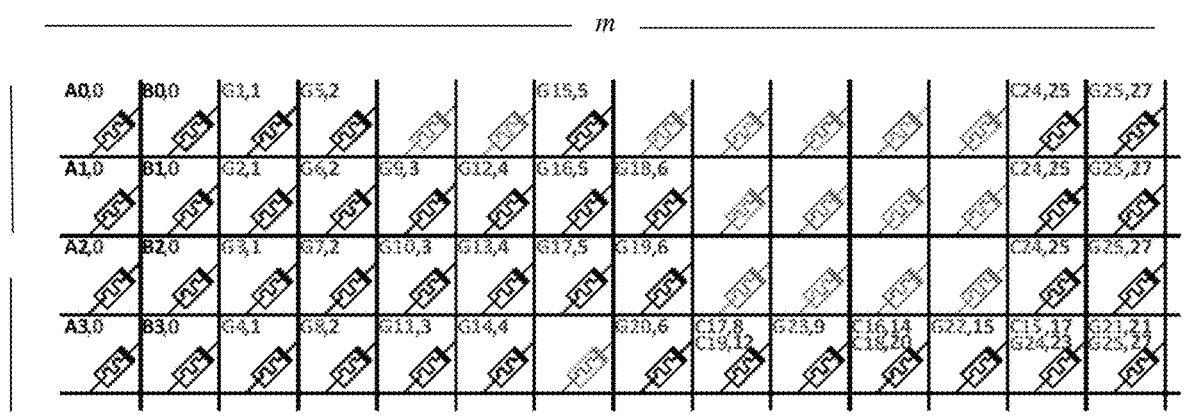
FIG. 5B provides a rendering of a MAGIC-based 4-bit binary in-memory comparator.

Binary Sorting Unit. A binary sorting unit (CAS unit) comprises a comparator and two multiplexers. Implementing an n-bit comparator by using basic logic gates requires (11n−2) NOR and (7n−2) NOT logic gates. FIGS. 4A and 5A show the respective logic and the NOR-based logic design of an embodiment of a 4-bit binary comparator. FIG. 5b shows an embodiment of the in-memory implementation using MAGIC for a 4-bit input. As shown, implementing this comparator using MAGIC NOR and NOT operations comprises a crossbar with n×m memristor-based memory cells, wherein n (number of rows) is a variable comprising the size (bits) of the data being compared and m (number of columns) determined by the following: (8+2n−2). A crossbar refers to a rectangular or square array of memristors arranged in rows and columns. For this binary sorting unit, the memristor crossbar array comprises a total of (12n−8) memristors. In the pictured embodiment of FIG. 5B, the crossbar has 4×14 memory cells. The input data (i.e., A and B) in binary format is stored in two different columns, each column containing n memristors (in this example, n=4). This storage can be seen in FIG. 5B, where input data A is stored in the first column, and input data B is stored in the second column.

The computation includes NOR, NOT, and copy operations, which is detailed in the 4-bit embodiment of FIG. 5A. Each $G_{i,j}$ memristor in FIG. 5B corresponds with a logical gate (operation) i in FIG. 5A. For example, logic gate 1 in FIG. 5A corresponds to memristor G1,1 on FIG. 5B. $C_{i,j}$s on the other hand, shows the copy operation i, in which the state of $G_i$ memristor is duplicated, which occurs in logic gate 24. $G_i$ memristor in FIG. 5B holds the output of the i-th gate. $C_i$ memristor copies the state of $G_i$ memristor. The second number shown on each memristor (e.g., 2 in G5,2) determines the processing cycle in which the memristor operates. The index j comprises the cycle number in which an operation is performed. In some embodiments, a memristor participates in two operations. The number of reused memristors is calculated by: 11n. For example, the memristor at the right-bottom end of FIG. 5B, is once used at cycle 21 in gate (operation) 21 and once at cycle 27 in gate (operation) 25.

To this end, in each clock cycle or pulse, the memristor controller applies a voltage to the crossbar columns (m) and rows (n) to execute one or more NOR or NOT operations concurrently. All memristors with the same cycle number produce their output value at the same time. The number of required logical operation cycles to complete the comparison steps is calculated by: (18+(n−1)).

When possible, memristors are reused to avoid increasing area, i.e., the number of used memristors. The memristors that are being re-used as an output must be initialized to LRS in an additional clock cycle before reusing. The reused initiation cycles is calculated by: (n+2). For FIG. 5B, the comparison result (i.e., the output of Gate 24; Output 5 49) is ready at cycle 23. At this time, some copies from the comparison result and its complement must be made. These will be used as the select inputs of the maximum and minimum multiplexers shown in FIG. 4B and FIG. 6. To this end, first, three copies of the output of Gate 24 are made on three memristors in the same column and then invert these memristors on another column to make the required complements. This leads to a total processing time of 27 cycles plus one initialization cycle. The total number of cycles can be calculated by: (6n−15).

To illustrate, FIG. 5A provides the logic diagram for the compare operation for two 43-bit data sets, A and B. To perform then compare process, the value of A's individual bits are compared to their corresponding B individual bits (i.e., $A_0$ is compared to $B_0$, $A_1$ is compared to $B_1$, etc.) through simultaneous NOR operations in pulse 1. The output of this comparison is each bit's Output 0 (26, 27, 28, and 29). Next, the first bit in data set A ($A_0$) is compared through a NOR operation to its corresponding Output 0 26 to generate a corresponding Output 1 30. In the same cycle, the remaining bits in data set A are compared to each's corresponding Output 0 (e.g., $A_1$ to Output $0_1$) to generate each bits corresponding Output 1A (32, 34, and 36). In the next clock cycle (3), the second through fourth bits of data set B are compared to each's corresponding Output 0 to generate each's corresponding Output 1B (31, 33, 35). In the fourth clock cycle, for the second bit in the data sets through bit (here bits 2, 3, and 4), each bits' Output 1A is compared to Output 1B to obtain a corresponding Output 2B (38, 40, and 42). In the following (fifth) cycle, the values for Output 1 and all Outputs 1A except for n bit (here 4) are inverted to obtain an Output 2 37 and Outputs 2A (39 and 41). Next, the values of Outputs 2B are inverted to obtain Outputs 3 (43, 44, and 45). In the 9th cycle, Output 2A for bit n−1 and Output $3_n$ 45 are compared to obtain its corresponding Output 4 48. In cycle 15, Output 2A 39 for the n−2 bit is compared to the subsequent Outputs 2B (44 and 45) to obtain its corresponding Output 4 47. This pattern continues until the first bit is reached, wherein the Output 2 is compared to all Output 2Bs to obtain its Output 4 46. In this example, this comparison occurs in the 21st cycle. Then, all Output 4s are compared to generate Output 5 49, which is the result of the comparison process. Copies of Output 5 are then made and stored in the same column as the memristor storing Output 5. The value of Output 5 is then inverted to create Output 6 50 which is stored in a separate column from Output 5 and its copies. All comparisons made during this process are done through the NOR operation.

Figure 4B:
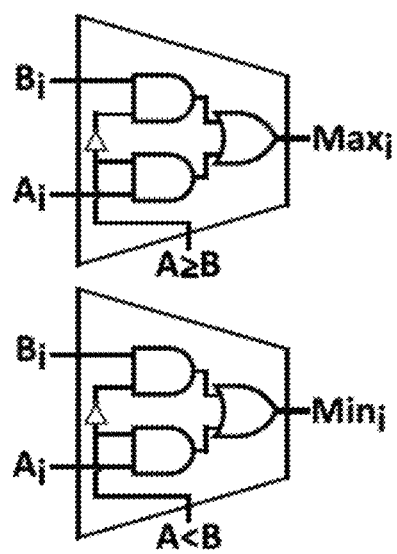
FIG. 4B provides the logic design of a multi-bit binary 2-to-1 multiplexer for Max/Min selection.
Figures 6A, 6B:
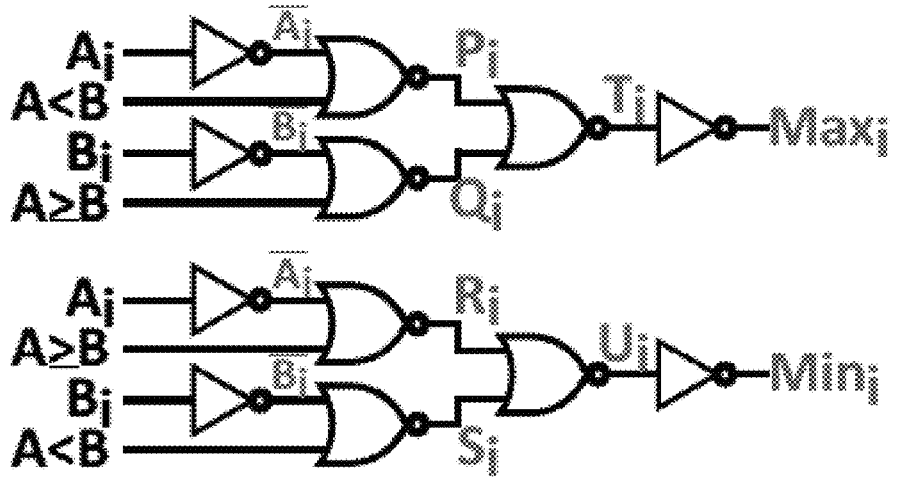
FIG. 6A provides a rendering of a NOR-based logic design of a multi-bit binary 2-to-1 multiplexer.
FIG. 6B provides a rendering of an in-memory MAGIC-based 4-bit binary multiplexer for Max/Min selection. The second number shown on each memristor (e.g., 3 in P0,3) determines the processing cycle in which the memristor operates.

After the comparison step, the value of only four columns (two input data and two comparison results) are needed to implement the multiplexer part of the sorting unit. Hence, the rest of the memristors can be reused. FIG. 4B and FIG. 6 show the logic and the NOR-based logic circuit for a multi-bit 2-to-1 multiplexer. FIG. 6B shows an embodiment of a MAGIC-based in-memory design for the two 4-bit multiplexers the sorting circuit requires to select the maximum and minimum data. In implementing the multiplexers, this architecture and method re-uses the memory cells of the comparison step that are not used anymore. To this end, the columns are initialized to LRS in one clock cycle. The input data is inverted in two clock cycles, cycles 1 and 2, shown in FIG. 6B. The first multiplexer produces the maximum value in cycles 3 to 6. The minimum value is produced by the second multiplexer through cycles 7 to 10. Since three columns used by the first multiplexer (i.e., P, Q, T) are being re-used by the second multiplexer, an additional cycle is considered for the initialization of these columns before execution of the second multiplex operation. The execution of the multiplexers, therefore, takes two initialization and 10 operation cycles. Hence, execution of the proposed in-memory basic binary sorting takes a total of 39 processing cycles plus one initialization cycle.

The disclosed method can then be extended from sorting of 4-bit data to higher data-widths, namely 8-, 16-, 32-, and in general n-bit data. FIG. 11 reports the required resources, the number of cycles, and energy consumption from testing. The area, the latency, and the energy consumption of the proposed basic binary sorting design increases linearly by increasing the data-width.

Complete Binary Sort System. A complete sorting network is made of basic sorting units (i.e., CAS blocks). In the bitonic sorting, the network recursively merges two sets of size N/2 to make a sorted set of size N. FIG. 1B shows the CAS network for an 8-input bitonic sorting. As it can be seen, the network is made of 24 CAS units. In general, an N-input bitonic sorting network requires $$U_{CAS}=N\times \log_2(N)\times (\log_2(N)+1)/4 \qquad (1)$$

CAS units. These CAS units can be split into $$S=\log_2(N)\times (\log_2(N)+1)/2 \qquad (2)$$

steps (also known as stages), each with N/2 CAS units that can operate in parallel.

Figure 7:
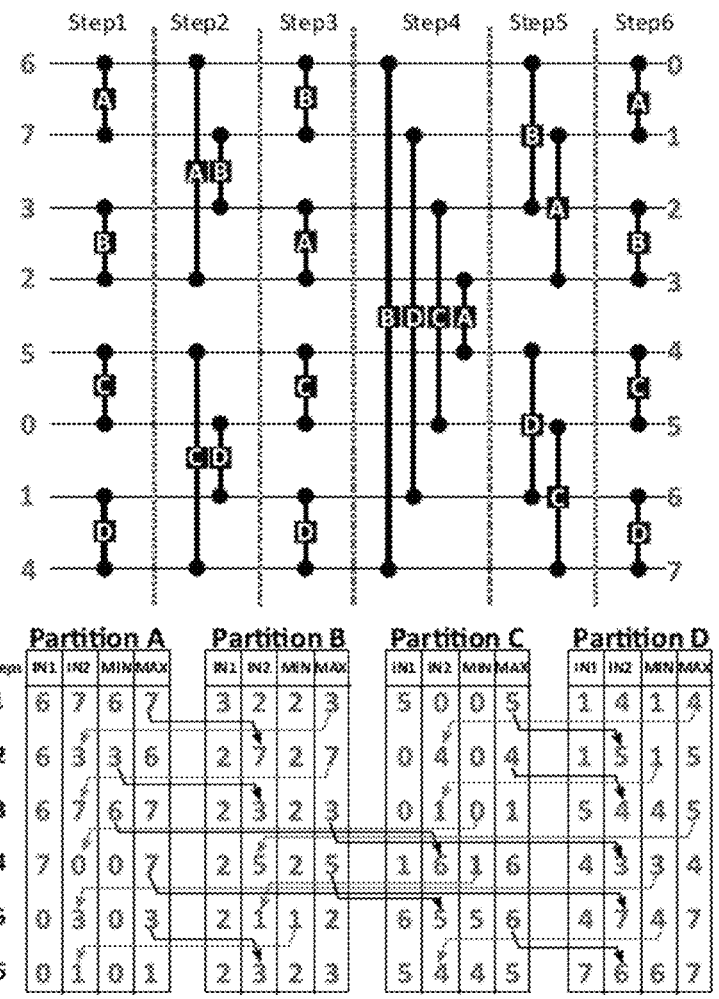
FIG. 7 provides a high-level flow of 8-input bitonic disclosed memory sorting method.

The memory is split into multiple partitions to enable parallel execution of different CAS operations in each bitonic CAS stage. FIG. 7 shows the mechanisms for implementing an 8-input bitonic sorting network in memory. The memory is split into four partitions, namely partitions A, B, C, and D (each marked on a black vertical line in the bitonic network representation). The number of partitions is decided based on the number of CAS units that can run in parallel (i.e., N/2). Each partition includes two out of the eight unsorted input data. The sorting process is split into six steps equal to the number of CAS groups (stages). In the first step, the two inputs in each partition are sorted using the basic sorting operation earlier discussed. In the second step, each maximum number (i.e., the larger number between the two in the partition) found by the sorting operations of the first step is copied to another partition where it is needed. The bitonic network determines the destination partition. For instance, the maximum found by executing the sorting operation in partition A (i.e., the input with a value of 7 in the example of FIG. 7) will be copied into partition B to be compared with the minimum number between the two initial data in partition B of the first step. Similarly, in each one of the next steps (i.e., steps 3 to 6), one output data from each partition is copied to another partition, and a sorting operation is executed.

In each step, the sorting in different partitions are executed in parallel. After six steps and the execution of a total of 24 (=4×6) basic sorting operations, the sorted data is ready in the memory. Each basic sorting operation is implemented based on the in-memory basic binary sorting earlier discussed. FIG. 12 shows the total number of processing cycles, the required size of crossbar memory, and the energy consumption of different sizes of in-memory bitonic networks. The total number of processing cycles, PC, is calculated using:

$$PC_t=S\times(1+PC_b)+CP, \qquad (3)$$

where $PC_b$ is the number of processing cycles necessary to execute a basic sorting operation, CP is the number of copy operations, and S the number of sorting steps. The required size of crossbar memory ($M_t$) is found by $$M_t = n \times \frac{N}{2} \times M_b,$$

where $M_b$ is the size of the crossbar memory required for one basic sorting unit.

In-Memory Unary Sorting. Further disclosed is a method for sorting unary data in memory to avoid the overheads of off-memory processing in the unary systems. First addressed is the basic operation of sorting two unary bit-streams in memory and then addressed is the sting of an enablement of a complete unary sorting network.

Figure 8:
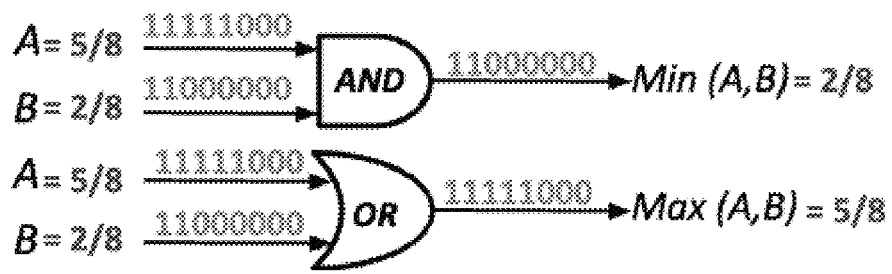
FIG. 8 provides an example of performing maximum and minimum operations on unary bit-streams.

Unary Sorting Unit. The maximum and minimum functions are the essential operations in a basic sorting unit. Performing bit-wise logical AND on two unary bit-streams with the same length gives the minimum of the two bit-streams. Bit-wise logical OR, on the other hand, gives the maximum of the two unary bit-streams with the same-length. FIG. 8 shows an example of the maximum and the minimum operation on two unary bit-streams. The example presents these operations in a serial manner by processing one bit of the input bit-streams at each cycle. While the serial approach is extremely simple to implement with only one pair of AND and OR gates, it incurs a long latency proportional to the length of the bit-streams. In this work, we choose the precision of binary to unary conversion equal to the data-width, n. This means, an n-bit data in the binary domain corresponds to a $2^n$-bit bit-stream in the unary domain. This implies a latency of $2^n$ cycles with a serial unit. Parallel sorting of two n-bit precision data represented using two $2^n$-bit bit-streams requires performing $2^n$ logical AND operations (to produce the minimum bit-stream), and $2^n$ logical OR operations (to produce the maximum bit-stream) in parallel as shown in FIG. 2B. The suitability of the memristive crossbar for running parallel logical operations in-memory makes it a perfect place for low-latency parallel sorting of unary bit-streams.

Figure 9A:
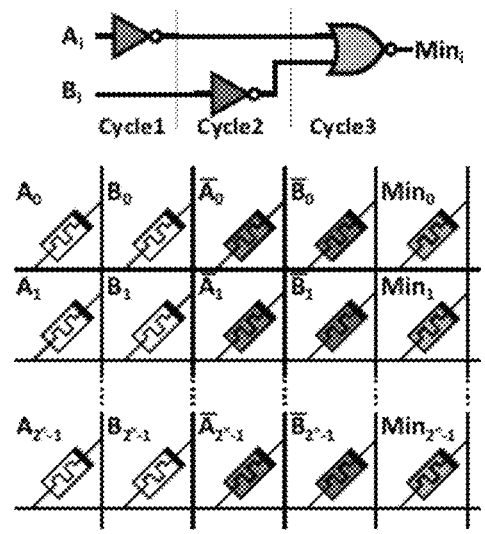
FIG. 9A provides a rendering of the disclosed in-memory minimum operation.
Figure 9B:
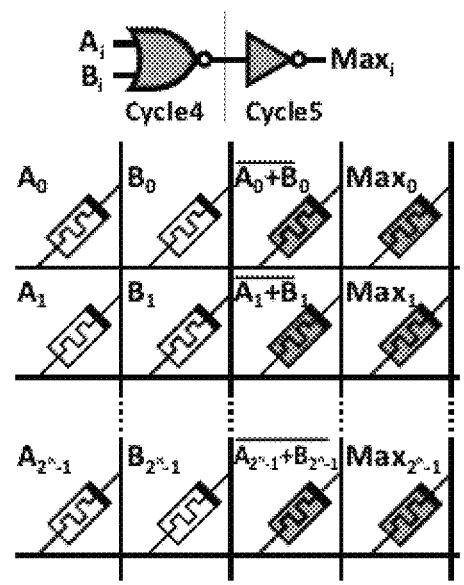
FIG. 9B provides a rendering of the disclosed in-memory maximum operation on two unary bit-streams.

FIG. 9 shows the design for MAGIC-based in-memory execution of minimum and maximum operations on two unary bit-streams. As shown in FIG. 9, implementing this sorting unit using MAGIC NOR and NOT operations requires a memristor crossbar proportional to the length of the bit-streams. The unsorted unary data (i.e., A and B bit-streams) is stored in two different columns. Both inputs have the same length of $2^n$. As shown in FIG. 9A, the AND operation (minimum function) is realized by first inverting the bit-streams through MAGIC NOT and then performing bit-wise MAGIC NOR on the inverted bit-streams. This effectively implements the AND operation as $A \wedge AB = A \vee B$. The first and the second bit-stream are inverted in the first and the second cycle, respectively. The NOR operation is executed in the third cycle. As shown in FIG. 9B, the OR operation (maximum function) is achieved by first performing MAGIC NOR on the input bit-streams and then MAGIC NOT on the outputs of the NOR operations. Hence, the execution of the OR operation takes two cycles.

The columns that we use during the execution of the AND operation to store the inverted version of the bit-streams (e.g., the third and fourth columns in FIG. 9A) are re-used in the execution of the OR operation to avoid using additional memristors. In contrast to the proposed in-memory binary sorting previously discussed, which has a variable latency dependent on the width of the input data, the processing latency of the proposed unary sorting is fixed at five cycles and does not change with the data-width. FIG. 13 shows the required resources, number of cycles, and energy consumption of the proposed basic sorting unit for different bit-stream lengths.

The number of memristors is directly proportional to the length of the bit-streams. In a fully parallel design approach, the size of the memory, particularly the number of rows, defines an upper-limit on the maximum data-width for the to-be-sorted unary data. In such a system, bit-streams with a length longer than the number of rows can be supported by splitting each bit-stream into multiple shorter sub-bit-streams, storing each sub-bit-stream in a different column, and executing the CAS operations in parallel. The sub-results will be finally merged to produce the complete minimum and maximum bit-streams. This design approach sorts the data with reduced latency as the primary objective. A different approach for sorting long bit-streams is to perform CAS operations on the sub-bit-streams in a serial manner by re-using the CAS unit(s). Above approach reduces the area (number of used memristors) at the cost of additional latency. In this case, after sorting each pair of sub-bit-streams, the result is saved, and a new pair of sub-bit-stream is loaded for sorting. Assuming that each input bit-stream is split into N sub-bit-streams, the number of processing cycles to sort each pair of input data increases by a factor of N. Some additional processing cycles are also needed for saving each sub-output and copying each pair of sub-input. Combining the parallel and the serial approach is also possible for further trade-offs between area and delay. These approaches increase the range of supported data-widths but incur a more complicated implementation and partition management.

Complete Unary Sort System. Implementing a bitonic sorting network in the unary domain follows the same approach as earlier presented for binary implementation of sorting networks. The number of sorting steps and the required number of basic sorting operations are the same as those of the binary sorting network design. The essential difference, however, is that in the unary sorting system, the data is in the unary format. Therefore, the basic 2-input sorting operation should be implemented based on the unary sorting unit. FIG. 12 shows the number of processing cycles and the required size of memory for implementing unary bitonic networks of different sizes and reports the latency, area, and energy of these networks as well.

Circuit-Level Simulations. To validate the disclosed design and method, a 16×16 crossbar and necessary control signals is implemented for circuit-level evaluation of the proposed designs. For memristor simulations, the Voltage Controlled Threshold Adaptive Memristor (VTEAM) model were implemented. The Parameters used for the VTEAM model can be seen in FIG. 14. The designs were evaluated in an analog mixed-signal environment by using the Spectre simulation platform with 0.1 ns transient step. For this embodiment of MAGIC operations, apply $V_{SET}$=2.08V with ins pulse-width to initialize the output memristors to LRS. For the simplicity of controller design, we consider the clock cycle period of 1.25 ns and $V_0$ pulse-width of ins for all operations. $V_0$ voltage for NOT, 2-input NOR, 3-input NOR, and 4-input NOR is 1.1V, 950 m V, 1.05V, and 1.15V, respectively. We perform the copy operations by using two consecutive NOT operations.

To estimate the total energy of in-memory computations, we first find the energy consumption of each operation. The energy number measured for each operation depends on the states of input memristors (i.e., LRS, HRS). We consider all possible cases when measuring the energy of each operation. For example, the 3-input NOR has eight possible combinations of input states. We consider the average energy of these eight cases as the energy of 3-input NOR. The reported energy for the proposed in-memory sorting designs is the sum of the energy consumed by all operations.

Comparison of In- and Off-Memory. We compare the latency and energy consumption of the proposed in-memory binary and unary sorting designs with the conventional off-memory CMOS-based designs for the case of implementing bitonic networks with a data-width of eight. For a fair comparison, we assume that the to-be-sorted data are already stored in memristive memory when the sorting process begins and hence do not consider the delay for initial storage. We do not consider this latency because it is the same for both cases of the proposed in-memory and the off-memory counterparts. For the case of off-memory binary designs, assume 8-bit precision data are read from and written to a memristive memory. For the case of off-memory unary design, two approaches are evaluated: 1) unary data (i.e., 256-bit bit-streams) are read from and written to memory, and 2) 8-bit binary data are read from and written to memory. For the second approach, the conversion overhead (i.e., binary to/from unary bit-stream) is also considered. This conversion is performed off-memory using combinational CMOS logic. The conventional CMOS-based off-memory sorting systems read the raw data from memory, sort the data with CMOS logic, and write the sorted data into memory. These read and write operations take the largest portion of the latency and energy consumption. We use the per-bit read and write latency and per-bit energy consumption to calculate the total latency and energy of reading from and writing into the memristive memory. For the proposed in-memory designs, the entire processing step is performed in memory, and so there is no read and write operations from and to the memory. For the off-memory cases, we do not incorporate the transferring overhead between the memory and the processing unit as it depends on the interconnects used. We implemented the off-memory processing units using Verilog HDL and synthesized them using the Synopsys Design Compiler v2018.06-SP2 with the 45 nm NCSU-FreePDK gate library.

FIG. 16 shows the summary of performance results. As reported, the proposed in-memory designs provide a significant latency and energy reduction, compared to the conventional off-memory designs. That is, on average 14× and 37×, respectively, for the binary sorting. For the unary design, the average latency and energy reductions are 1200× and 138×, respectively. For the unary systems with the data stored in memory in a binary format, the proposed in-memory design can reduce the latency and energy by a factor of up to 65× and 9.7×, respectively. For a realistic and more accurate energy consumption comparison, however, the overhead of transferring data on the interconnect between the memory and the processing unit must be added for the off-memory cases. We note that these numbers are highly dependent on the architecture of the overall system and the interconnects used. Therefore, different system architectures may substantially change these numbers; however, they do not change the fact that our proposed method is more advantageous. In fact, they only change the extent of this improvement (and further increase it) since no data transfer happens in the in-memory sorting solution. Hence, by eliminating them, we present the minimum improvement obtained by our method and leave the further improvement to the final implementation details of designers.

Application to Median Filtering. Median filtering has been widely used in different applications, from image and video to speech and signal processing. In these applications, the digital data is often affected by noise. A median filter—which replaces each input data with the median of all the data in a local neighborhood (e.g., a 3×3 local window)—is used to filter out impulse noises and smoothen the data. A variety of methods for the implementation of Median filters have been proposed. Sorting network-based architectures made of CAS blocks are one of the most common approaches. The incoming data is sorted as it passes the network. The middle element of the sorted data is the median. We developed an in-memory architecture for a 3×3 median filtering based on our proposed in-memory binary and unary sorting designs.

FIG. 10 depicts a high-level flow of memory partitioning for an in-memory 3×3 Median filter design where the memory is split into multiple partitions. Here, partitions are A, B, C, D, and E. Each sorting unit sorts the data in one particular partition. All partitions, except E, are initialized with two out of the nine input data. The process is split into eight steps, each step executing some basic sorting operations in parallel. Compared to a complete sorting network, fewer sorting units are required as only the median value is targeted. The implementation of the Median filter is evaluated using both the proposed binary and unary bit-stream-based in-memory architectures.

FIG. 17 reports the latency, number of required memristors, and the energy consumption of the developed designs for (i) a single 3×3 Median filter and (ii) a 3×3 Median filter image processing system that processes images of 64×64 size. The corresponding latency and energy consumption of the off-memory CMOS-based binary and unary designs are also reported in FIG. 17. As it can be seen, the proposed in-memory binary and unary designs reduce the energy by a factor of 13× and 6.6×, respectively, for the image processing system.

Note the overhead latency and energy of transferring data on the bus or other interconnects for the off-memory cases were not incorporated, which is a large portion of energy of consumption in transferring data between memory and processing unit. By considering this overhead, the disclosed method would have a significantly larger advantage over others in a complete system.

The foregoing description sets forth exemplary methods, parameters, and the like. It should be recognized, however, that such description is not intended as a limitation on the scope of the present disclosure but is instead provided as a description of exemplary embodiments.

In the foregoing description of the disclosure and embodiments, reference is made to the accompanying drawings in which are shown, by way of illustration, specific embodiments that can be practiced. It is to be understood that other embodiments and examples can be practiced, and changes can be made, without departing from the scope of the disclosure. Such changes and modifications are to be understood as being included within the scope of the disclosure and examples as defined by the claims.

In addition, it is also to be understood that the singular forms "a," "an," and "the" used in the following description are intended to include the plural forms as well unless the context clearly indicates otherwise. It is also to be understood that the term "and/or" as used herein refers to and encompasses any and all possible combinations of one or more of the associated listed items. It is further to be understood that the terms "includes," "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Some portions of the detailed description that follow are presented in terms of algorithms and symbolic representations of operations on data bits within a computer memory. These algorithmic descriptions and representations are the means used by those skilled in the data processing arts to convey the substance of their work most effectively to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic, or optical signals capable of being stored, transferred, combined, compared, and otherwise manipulated. It is convenient at times, principally for reasons of common usage, to refer to these signals as bits, values, elements, symbols, characters, terms, numbers, or the like. Furthermore, it is also convenient at times to refer to certain arrangements of steps requiring physical manipulations of physical quantities as modules or code devices without loss of generality.

However, all of these and similar terms are to be associated with the appropriate physical quantities and are merely convenient labels applied to these quantities. Unless specifically stated otherwise as apparent from the following discussion, it is appreciated that, throughout the description, discussions utilizing terms such as "processing," "computing," "calculating," "determining," "displaying," or the like refer to the action and processes of a computer system, or similar electronic computing device, that manipulates and transforms data represented as physical (electronic) quantities within the computer system memories or registers or other such information storage, transmission, or display devices.

Certain aspects of the present invention include process steps and instructions described herein in the form of an algorithm. It should be noted that the process steps and instructions of the present invention could be embodied in software, firmware, or hardware, and, when embodied in software, they could be downloaded to reside on, and be operated from, different platforms used by a variety of operating systems.

The present invention also relates to a device for performing the operations herein. This device may be specially constructed for the required purposes or it may comprise a general-purpose computer selectively activated or reconfigured by a computer program stored in the computer. Such a computer program may be stored in a non-transitory, computer-readable storage medium such as, but not limited to, any type of disk, including floppy disks, optical disks, CD-ROMs, magnetic-optical disks, read-only memories (ROMs), random access memories (RAMs), EPROMs, EEPROMs, magnetic or optical cards, application-specific integrated circuits (ASICs), or any type of media suitable for storing electronic instructions and each coupled to a computer system bus. Furthermore, the computers referred to in the specification may include a single processor or may be architectures employing multiple processor designs for increased computing capability.

The methods, devices, and systems described herein are not inherently related to any particular computer or other apparatus. Various general-purpose systems may also be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention, as described herein.

The above description is presented to enable a person skilled in the art to make and use the disclosure, and it is provided in the context of a particular application and its requirements. Various modifications to the preferred embodiments will be readily apparent to those skilled in the art, and the generic principles defined herein may be applied to other embodiments and applications without departing from the spirit and scope of the disclosure. Thus, this disclosure is not intended to be limited to the embodiments shown but is to be accorded the widest scope consistent with the principles and features disclosed herein.

We claim:

1. An architecture for in-memory sorting of binary input data sets comprising:
 a power supply;
 a clock device;
 a network comprising a plurality of sorting units, each comprising:
  a comparator comprising a memristor crossbar array; and
  two multiplexors;
 wherein the memristor crossbar array comprises:
  n rows, wherein n is equal to the data set's number of bits;
  m number of columns, wherein m is equal to (8+2n−2); and
  a plurality of memristors arranged in said rows and columns;
 wherein the separate data sets are each stored in separate columns of the memristor crossbar array.

2. The architecture of claim 1, wherein the total number of sorting units is equal to (N×log 2(N)×(log 2(N)+1)/4), wherein N is equal to the number of inputs to the sorting network.

3. The architecture of claim 1, wherein the sorting units are split into stages.

4. A method for in-memory sorting of two input bitstream data sets comprising:
 (a) providing a memory architecture comprising:
  a power supply;
  a clock device;
  a network comprising a plurality of sorting unites each comprising a memristor crossbar array;
 (b) storing each data set in two columns in the memristor crossbar array;
 (c) splitting the network of sorting units into two or more stages, wherein each stage comprises at least two inputs;
 (d) sorting the inputs of each partition of sorting units, wherein such sorting in each partition is conducted in parallel and comprises:
  i. comparing the input data sets for each sorting unit;
  ii. deriving a maximum value from the sorting units for each partition;
  iii. copying the maximum value found by the sorting operation in one partition as an input to another partition;
  iv. repeating the copying step for all partitions;
  v. repeating the above sorting steps until the sorting process is complete, wherein the total number of processing cycles is equal to S×(1+PC$_b$)+CP, and wherein PC$_b$ comprises the number of cycles necessary to execute the sorting step for one partition, CP comprises the number of copy operations for the sorting steps for one partition, and S is the total number of sorting steps.

5. The method of claim 4, wherein the total number of stages is equal to log 2(N)×(log 2(N)+1)/2, wherein N is equal to the number of inputs to the sorting network.

6. The method of claim 4, wherein the number of partitions of sorting units is the equal to the number of sorting units that can run in parallel.

7. The method of claim 4, wherein the sorting step further comprises:
 (a) for each bit in an input binary bitstream data set, a value of said bit for a data set (Data Set A) is compared to a similarly positioned bit in the other data set (Data Set B) to generate an Output 0 for each bit;
 (b) comparing a first bit in Data Set A to the corresponding Output 0 for said bit to generate a corresponding Output 1;
 (c) comparing a second bit in Data Set A to the corresponding Output 0 for said bit to generate a corresponding Output 1A;
 (d) comparing a second bit in Data Set B to the corresponding Output 0 for said bit to generate a corresponding Output 1B;
 (e) repeating steps (c) and (d) for remaining subsequent bits to obtain a corresponding Output 1A and Output 1B for each comparison operation;
 (f) inverting a value of the first bits' corresponding Output 1 to obtain an Output 2;
 (g) for the second bit in the data sets through bit n−1:
  i. compare the corresponding Output 1A to Output 1B to obtain a corresponding Output 2B; and
  ii. invert a value of the corresponding Output 1A to obtain an Output 2A;
 (h) for the n bit, comparing the corresponding Output 1A to Output 1B to obtain a corresponding Output 2B;
 (i) inversing the values of all Output 2Bs to obtain a corresponding Output 3 for each;
 (j) comparing Output 2 and all Output 3s to obtain a corresponding Output 4;
 (k) comparing the Output 2A for the second bit to the Outputs 2B for the third bit through nth bit to obtain a corresponding Output 4;
 (l) comparing each subsequent Output 2A to the Outputs 2B for the sequential bit to obtain each corresponding Output 4, to where the last comparison is between Output 2A for bit n−1 and Output 2B for bit n;
 (m) comparing all Output 4s to obtain an Output 5;
 (n) copying Output 5 on one or more memristors in the same column of the memristor crossbar array as the memristor storing Output 5;
 (o) inverting Output 5 to obtain an Output 6; and
 (p) storing said Output 6 in a different column of memristors in the memristor crossbar array.

8. The method of claim 7, wherein the compare steps are performed using a NOR operation through application of a preconfigured voltage to applicable sections of the memristor crossbar array.

9. The method of claim 4, wherein the memory architecture further comprises two multiplexors and wherein the sorting step further comprises:
 (a) initializing the memristors that are not holding input data sets or an output of a comparison to be reused to a low resistive state;
 (b) initializing the input bitstream data set;
 (c) executing the first multiplexer to produce a maximum value of the input data sets; and
 (d) executing the second multiplexer to produce a minimum value of the input data sets.

10. The method of claim 4, wherein the sorting step further comprises:
- (a) for each bit in an input unary bitstream data set, inverting a value of a bit for one data set (Data Set A) and a value of a bit for a second data set (Data Set B) in one clock cycle;
- (b) comparing a resulting inverted values for the bits of the two data sets through a NOR operation in a second clock cycle to produce the minimum value;
- (c) storing the comparison results in the memristor columns where the above comparison step was performed; and
- (d) for each bit in an input unary bitstream data set, comparing each bit of Data Set A to the corresponding bit in Data Set B through a NOR operation and then inversing the resulting value to obtain the maximum value.

11. The method of claim 10, wherein the compare steps are performed using a NOR operation through application of a preconfigured voltage to applicable sections of the memristor crossbar array.

12. The method of claim 10, wherein the number of memristors is directly proportional to the length of the input bitstream data sets.

13. The method of claim 4, wherein the input bitstream data sets are in unary form and where the sorting process requires only five cycles to complete for each sorting unit regardless of width of the input bitstream data sets.

* * * * *